(12) United States Patent
Brown et al.

(10) Patent No.: US 8,410,784 B1
(45) Date of Patent: Apr. 2, 2013

(54) METHOD AND DEVICE FOR MEASURING STATIC CHARGE

(75) Inventors: Arlene M Brown, Normandy Park, WA (US); Grant J Erickson, Enumclaw, WA (US); Joe Heeter, Sammamish, WA (US); Robert Steinle, Seattle, WA (US); Kari L Stromsland, Seattle, WA (US); Winson Taam, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 513 days.

(21) Appl. No.: 12/617,176

(22) Filed: Nov. 12, 2009

(51) Int. Cl.
*G01R 29/12* (2006.01)

(52) U.S. Cl. .................................................. 324/457

(58) Field of Classification Search ............... 324/457
See application file for complete search history.

(56) References Cited

U.S. PATENT DOCUMENTS

| | | | |
|---|---|---|---|
| 2,515,182 A * | 7/1950 | Bennett | 244/1 A |
| 4,190,088 A | 2/1980 | Lalikos et al. | |
| 4,259,989 A | 4/1981 | Lalikos et al. | |
| 4,398,234 A * | 8/1983 | Brick et al. | 361/218 |
| 4,417,293 A | 11/1983 | Larigaldie | |
| 5,443,912 A | 8/1995 | Olson | |
| 5,808,536 A | 9/1998 | Sandlin, Jr. et al. | |
| 5,973,903 A * | 10/1999 | Tomerlin | 361/215 |
| 6,081,415 A | 6/2000 | Crawford et al. | |
| 6,295,366 B1 | 9/2001 | Haller et al. | |
| 6,375,120 B1 | 4/2002 | Wolnek | |
| 6,546,607 B1 | 4/2003 | Crawford et al. | |
| 6,900,642 B2 * | 5/2005 | Zank et al. | 324/457 |
| 6,906,537 B2 * | 6/2005 | Goldberg et al. | 324/721 |
| 7,221,164 B1 * | 5/2007 | Barringer | 324/330 |
| 7,313,972 B2 | 1/2008 | Reimer et al. | |
| 7,373,814 B1 * | 5/2008 | Brown et al. | 73/170.17 |
| 7,375,944 B2 | 5/2008 | Izaki et al. | |
| 7,411,401 B1 * | 8/2008 | Hull et al. | 324/457 |
| 7,596,997 B2 | 10/2009 | Brown et al. | |
| 2003/0136874 A1 * | 7/2003 | Gjerdrum | 244/10 |
| 2008/0246490 A1 | 10/2008 | Brown et al. | |

OTHER PUBLICATIONS

AFRL-TR-73-317 Flight Evaluation of Induced Noise Mechanisms on High Speed Aircraft, Oct. 1973 for pstatic on aluminum aircraft.
D6-24386, Interim Report # 10 Flight Evaluation of induced Noise Mechanisms of High Speed Aircraft, C.H. King 1969.
USPTO Notice of Allowance, dated Jan. 17, 2008, regarding U.S. Appl. No. 11/615,275, 7 pages.
USPTO Office Action, dated Apr. 13, 2009, regarding U.S. Appl. No. 12/120,840, 6 pages.
USPTO Notice of Allowance, dated Aug. 26, 2009, regarding U.S. Appl. No. 12/120,840, 6 pages.

\* cited by examiner

*Primary Examiner* — Jeff Natalini
(74) *Attorney, Agent, or Firm* — Yee & Associates, P.C.

(57) ABSTRACT

A device senses a static charge resulting from the impingement of particles on a surface, such as an aircraft's outer skin. The device includes a sensor adapted to be installed on the surface and a corona guard for guarding against corona discharge from the sensor.

15 Claims, 8 Drawing Sheets

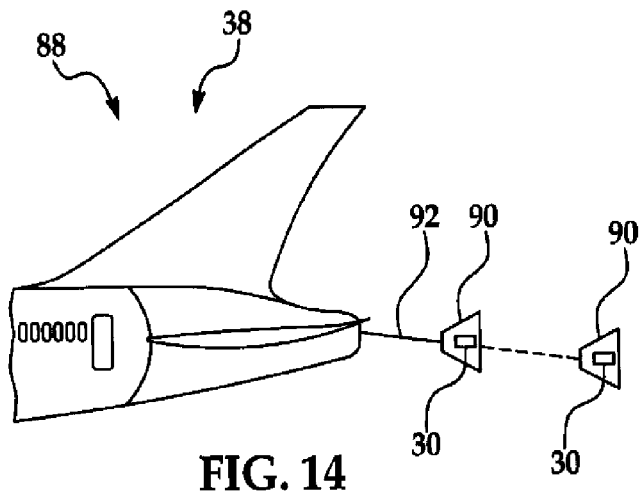
FIG. 14
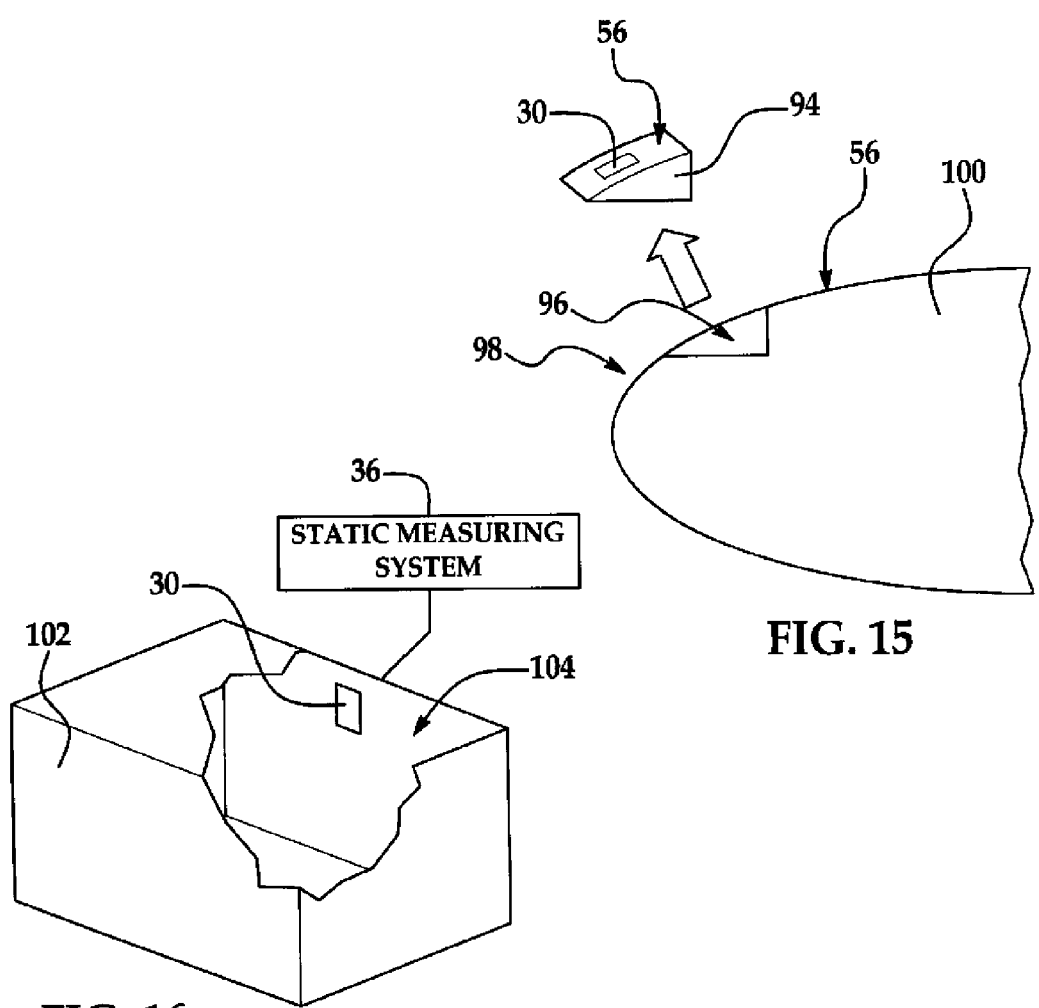
FIG. 15
FIG. 16

METHOD AND DEVICE FOR MEASURING STATIC CHARGE

TECHNICAL FIELD

This disclosure generally relates to static charges, and deals more particularly with a method and device for measuring precipitation or triboelectric charge build-up, especially on aircraft.

BACKGROUND

During flight, an aircraft may be subject to the impingement of particles on its various external surfaces, which leave an electrical charge on the aircraft due to either a triboelectric process or charged particle interactions, particularly while flying through rain, snow, dust or clouds. Triboelectric charging is a result of charge build up due to the impingement of particles on a surface. Precipitation static or "p-static" charging is a result of both triboelectric charging and the charge build up on surfaces intercepting charged particles and/or regions. Both types of charging may be removed by using various types of discharge devices. The accumulation and discharge of precipitation or p-static may lead to disruptions in RF (radio frequency) radio communication and other undesirable effects. The term p-static as used herein means charge build up due to either triboelectric or precipitation processes.

P-static sensors have been developed for use on aircraft that provide a quantitative measure of the level of charge build up due to tribelectric or precipitation processes, however these sensors have been primarily used to perform controlled tests in which p-static levels are measured during aircraft certification processes required by regulatory authorities. However, existing p-static sensors may not be capable of measuring p-static to higher performance standards required by regulatory authorities for new applications, such as for composite aircraft.

Accordingly, there is a need for a method and device for measuring charge build up that may provide high levels of accuracy and which are suitable for use in new applications on aircraft. There is also a need for a p-static sensor that may be permanently installed on an aircraft to measure charge build up for purposes of controlling and/or monitoring various onboard flight systems.

SUMMARY

In accordance with the disclosed embodiments, a method and device are provided for measuring p-static charge that may accumulate on a surface such an aircraft skin, as a result of particles impinging on the skin surface. The disclosed p-static sensor device may be used to perform tests in which static charge is measured for purposes of determining regulatory compliance. However, the device may also be permanently installed on aircraft and used to generate p-static charge measurements that represent a variable, which in turn may be used to control or monitor any of various on-board flight systems. The device includes a corona guard which may reduce RFI (radio frequency interference) caused by corona discharge from the sensor, and which may allow use of the sensor in other applications on the aircraft. The disclosed p-static charge sensor may be permanently installed at any of various locations on the aircraft to sense the accumulation of static charge, including within fuel tanks on the aircraft.

According to one disclosed embodiment, a device is provided for sensing p-static charge resulting from the impingement of particles on a surface. The device comprises a sensor adapted to be installed on the surface, and a corona guard for guarding against corona discharge from the sensor. The sensor may include first and second dielectric layers, and an electrically conductive layer sandwiched between the first and second dielectric layers. The conductive layer includes a detector region that is exposed to particle impingement on the surface. Means may be provided for heating the sensor device to avoid ice build-up.

According to another embodiment, apparatus is provided for sensing p-static charge resulting from impingement of particles on an aircraft. The apparatus comprises a p-static sensor device and means for mounting the p-static sensor device on the aircraft. The p-static sensor device may include a p-static charge sensor and a corona guard for guarding against corona discharge from the sensor. In one embodiment, the mounting means includes a drogue having the p-static sensor mounted thereon and a tether between the aircraft and the drogue for towing the drogue a preselected distance behind the aircraft. In another embodiment, the mounting means includes a module having the p-static sensor device mounted thereon and removable from the aircraft. In a further embodiment, the p-static sensor device is mounted within the interior of a fuel tank on the aircraft for measuring charge accumulation within the fuel tank. In still another embodiment, the mounting means may include a substrate having the p-static sensor device secured thereon and fastening means for removably fastening the substrate on the aircraft.

In accordance with still another embodiment, a device is provided for measuring charge accumulation inside a fuel tank. The device includes a p-static charge sensor mounted on the inside of the fuel tank and means for measuring the charge accumulation on the sensor. A conductor is provided for coupling the detector with the measuring means. The sensor may include a corona guard for guarding against corona discharge from the sensor.

According to a further embodiment, a method is provided for measuring static charge resulting from or impingement of particles on an aircraft. The method includes placing a static charge sensor on the aircraft and using the sensor to accumulate a static charge resulting from the flow of particles over the sensor or impingement of particles on an aircraft. The method further includes suppressing corona discharge from the sensor by placing a corona guard around the sensor, and converting the static charge on the sensor into data related to the magnitude of the accumulated charge.

According to still another embodiment, a method is provided of controlling a system onboard an aircraft. The method includes sensing the accumulation of charge on the aircraft resulting from impingement of particles on an aircraft, and measuring the charge accumulation. The charge measurements may be used to control at least one system onboard the aircraft. The method may further include sensing the impingement of particles on the aircraft and analyzing the impinging particles. The combined results of the particle analysis and measurement of the charge may be used to control at least one system onboard the aircraft.

The disclosed embodiments satisfy the need for a method and device for measuring the accumulation of charge on an aircraft which is rugged, reliable and may be used in a variety of applications on the aircraft to assess the affects of triboelectric and precipitation charging, and/or to monitor and/or control one or more systems onboard the aircraft.

BRIEF DESCRIPTION OF THE ILLUSTRATIONS

FIG. 14 is an illustration of a side view of an aircraft tail assembly showing the sensor device mounted on an extendable drogue.

FIG. 15 is an illustration of a sectional view of a leading edge of an aircraft wing, showing the use of a removable module to mount the sensor device on the aircraft.

FIG. 16 is an illustration of a perspective view of a fuel tank, portions being broken away to reveal the disclosed static sensor mounted within the fuel tank.

DETAILED DESCRIPTION

Figure 1:
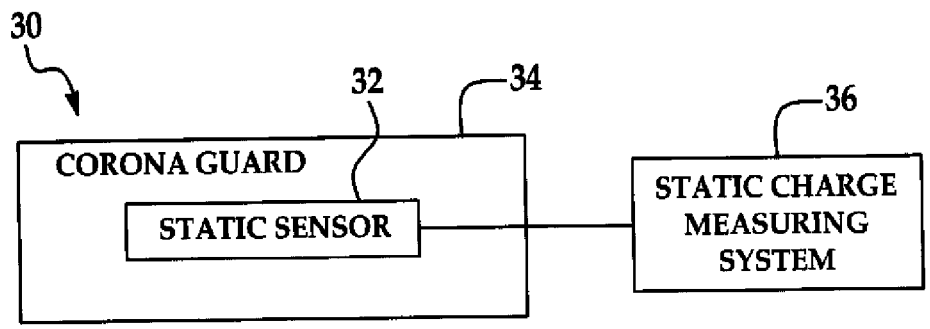
FIG. 1 is an illustration of a functional block diagram of a sensor device for measuring charge accumulation.
Figure 2:
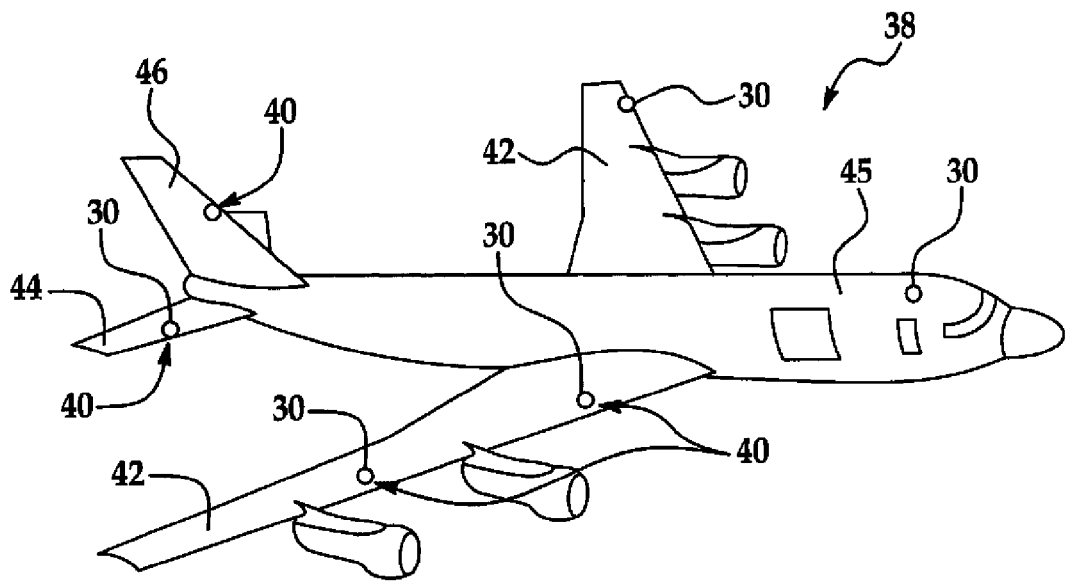
FIG. 2 is an illustration of a perspective view of an aircraft showing locations where the sensor device of FIG. 1 may be installed.

Referring first to FIGS. 1 and 2, the disclosed embodiments relate to a p-static charge sensing device 30 which broadly comprises a p-static sensor 32 and a corona guard 34. The static sensor 32 is adapted to accumulate a precipitation static charge which may be measured by a p-static charge measuring system 36. The device 30 may be mounted at any of various locations on an aircraft 38 (FIG. 2) including but not limited to the leading edges 40 of wings 42, horizontal stabilizers 44, vertical stabilizers 46 or the fuselage 45. The p-static sensor 32 accumulates a charge that is representative of the charge accumulation on the aircraft 38. Aircraft charging due to precipitation static (p-static) may be caused either by the presence of the aircraft 38 in an environment containing charged particles or charged regions such as a thunderstorm, and/or by triboelectric charging, which is a form of frictional charging that may be caused by rain, snow, or dust particles impinging upon surfaces on the aircraft 38 during flight. Either of these charging mechanisms may lead to RFI (radio frequency interference), also known as p-static, caused by any of several mechanisms of charge redistribution, including corona discharges, streamer discharges on dielectric surfaces, and arc-overs. Corona discharges have spectral energy primarily in the LF (low frequency) through HF (high frequency) region, and potentially may have significant energy levels in the VHF (very high frequency)/UHF (ultra high frequency) bands.

Figure 3:
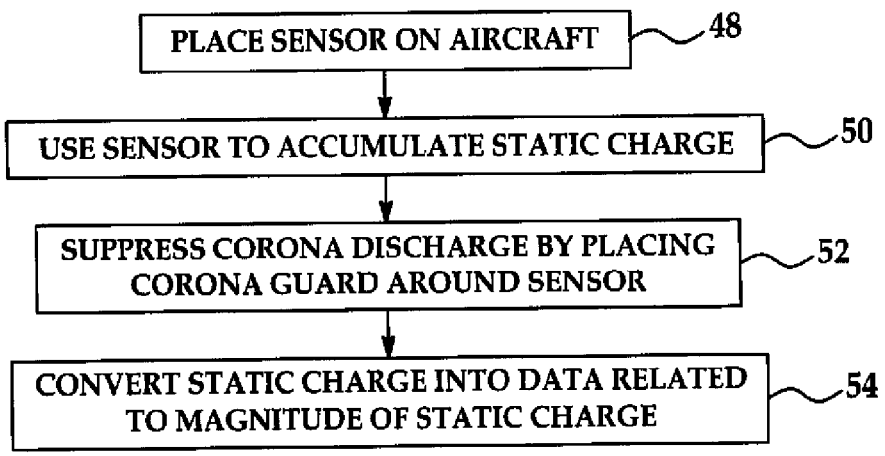
FIG. 3 is an illustration of a flow diagram of a method for measuring charge accumulation using the sensor device of FIG. 1.

As will be discussed below in more detail, the sensor device 30 may be employed to measure p-static charge accumulation at various locations on the aircraft 38 for testing purposes, or for the purpose of controlling onboard systems. FIG. 3 illustrates the steps of a method of measuring the p-static charge accumulation on an aircraft 38, using the sensor device 30. Beginning at 48, the sensor device 30 is mounted at a desired location 40 on the aircraft 38. As shown at 50, the static sensor 32 is used to accumulate p-static charge on the aircraft 38 as a result of various forms of particulates which impinge upon the aircraft 38 during flight. At 52, a corona discharge (not shown) from the p-static sensor 32 is suppressed by placing the corona guard 34 around the sensor 32. At step 54, the static charge accumulated on the p-static sensor 32 is converted into data that is related to the magnitude of the accumulated charge on the sensor 32.

Figure 4:
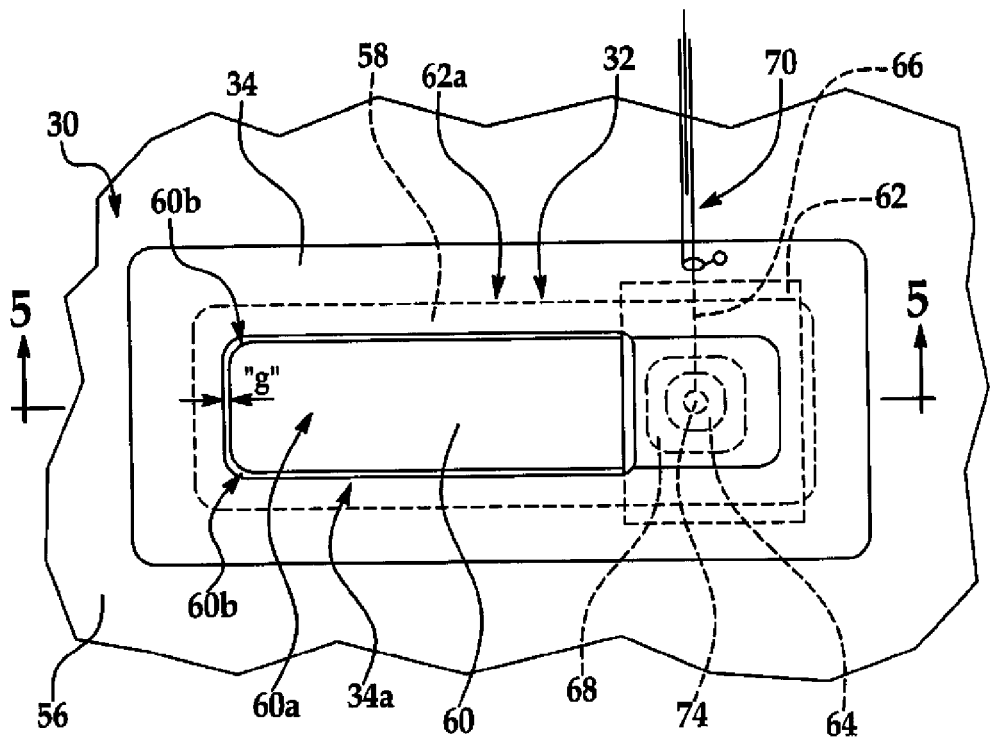
FIG. 4 is an illustration of a plan view of the p-static sensor device, wherein various hidden layers of the device are showing by broken lines.
Figure 5:
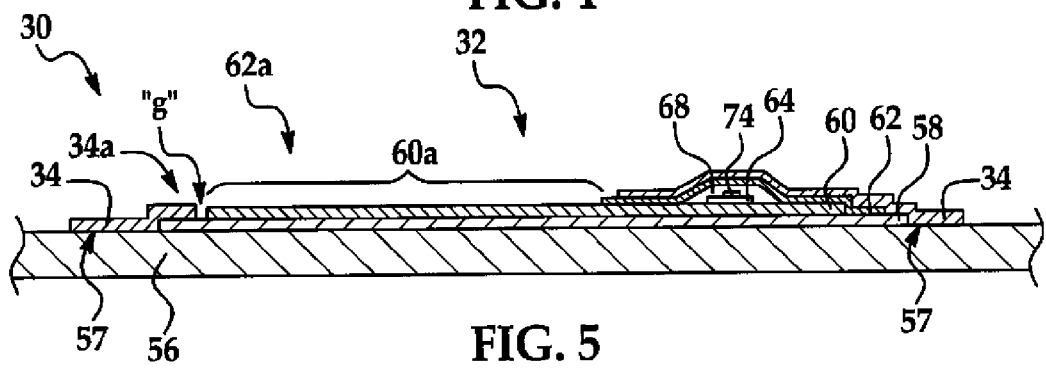
FIG. 5 is an illustration of a sectional view taken along the line 5-5 in FIG. 4.
Figure 6:
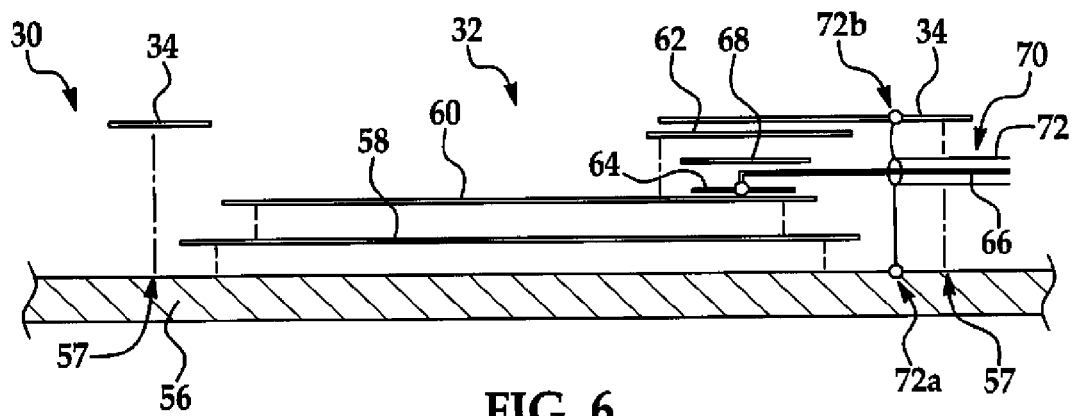
FIG. 6 is an illustration of an exploded, sectional view in which the layers of the sensor are shown diagrammatically.

Attention is now directed to FIGS. 4, 5 and 6 which illustrate further details of the sensor device 30 which, in the exemplary embodiment, has been mounted on an outer skin 56 of the aircraft 38 (FIG. 2). Broadly, the sensor comprises a conductive layer 60 sandwiched between a lower dielectric layer 58 and an upper dielectric layer 62. A portion 62a of the upper dielectric layer 62 includes an opening 62a therein which exposes a portion 60a of the conductive layer 60, that will be referred to hereinafter as an exposed detector region 60a. Additional intervening layers such as adhesive layers may also be present, but are not shown in the Figures for clarity. As best seen in FIG. 4, the exposed detector region 60a is generally rectangular, although other shapes are possible. The detector region 60a includes corners 60b that are preferably radiused to reduce corona, however other corner shapes that reduce corona may be possible. The detector region 60a provides a surface area on the conductive layer that is configured to accumulate p-static charge produced by impinging particles (not shown) during flight. As will be discussed in more detail below, this accumulated charge build-up can be sensed and displayed for use by the pilot, as well as for test purposes and/or for controlling certain onboard fight systems.

A conductor 66, which may be a wire, is electrically connected to the conductive layer 60 by means of a solder connection 74 and to a conductive patch 64 which overlies the conductive layer 60. A second conductive patch 68 overlies the first conductive patch 64 and the solder connection 74. The patches 64, 68 are configured to assist in mechanically and electrically securing the conductor 66 to the conductive layer 60. As shown in FIG. 6, the conductor 66 may form part of a twisted wire pair 70 wherein a second wire 72 comprises a ground shield that is connected at 72a and 72b respectively to the skin 56 and the corona guard 34.

Dielectric layers 58, 62 may comprise any material or combination of materials that provide suitable insulation between the conductive layer 60 and the surrounding environment and related structures. In the illustrated embodiment, the bottom dielectric layer 58 insulates the conductive layer 60 from the aircraft skin 56, and the top dielectric layer 62 insulates the conductive layer 60 from the surrounding environment while also helping to protect and secure the conductor 66.

Depending upon the particular application, it may be desirable that the dielectric layers 58, 62 as well as the conductive layer 60 be somewhat flexible so that they may conform to any curvatures present in the skin 56. The dielectric layers 58, 62 may comprise any of a variety of suitable elastomeric insulating materials such as, without limitation, relatively thin layers of polyurethane which are commercially available and may be relatively weather resistant. The conductive layer 60 may comprise a relatively thin layer of aluminum or an aluminum alloy. For example in one embodiment, the conductive layer 60 may comprise an aluminum tape.

The corona guard 34 is generally rectangular in shape and overlies the sensor 32. In one embodiment, the corona guard 34 may comprise commercially available aluminum "speed tape" from which a non-conductive adhesive layer (not shown) has been removed.

Figure 7:
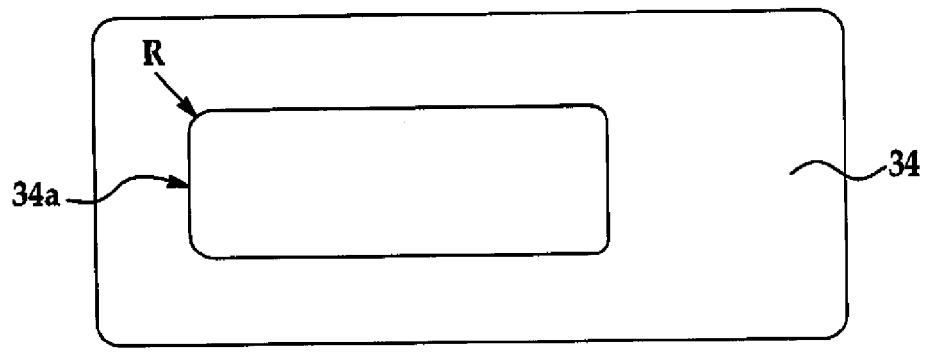
FIG. 7 is an illustration of a plan view of the corona guard.
Figure 8:
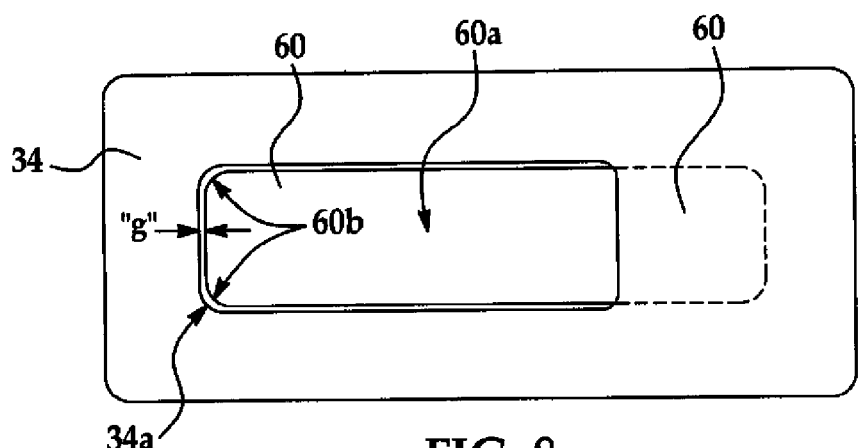
FIG. 8 is an illustration similar to FIG. 7 but also showing the conductive layer of the sensor, including the detector region.

The corona guard 34 is substantially flat and is electrically connected directly to the skin 56 and to the ground shield 72 of the wire 70, as shown in FIG. 6. The guard 34 includes a generally rectangular cut out area 34 that circumscribes the exposed detector region 60a. The dimensions of the cutout 34a in the guard 34 are slightly larger than that of the exposed detector region 60a, thereby forming a small air gap "g" between the conductor 60 and the guard 34 in the area of the detector region 60a. The gap "g" electrically insulates the conductive layer 60 from the guard 34 in the area of the exposed detector region 60a. The size of the air gap "g" is selected such that corona discharge from the conductive layer 60 is drained through the gap "g" to the guard 34 and into the grounded skin 56. As best seen in FIGS. 5 and 6, the corona guard 34 overlies the connection between the conductor 66 and the conductive layer 60, however the guard 34 is electrically insulated from the conductive layer 60 by means of the top dielectric layer 62. Thus, all areas of the corona guard 34 are electrically insulated from the conductive layer 60 either by the air gap ("g") or the dielectric layer 62. FIGS. 7 and 8 illustrate details of the corona guard 34 and the exposed detector region 60a of the conductive layer 60. The cutout 34a in the corona guard 34 includes radius corners "r" which generally conform to the radius corners 60b of the conductive layer 60.

Additional details of a p-static sensor 32 suitable for use in the device 30 is disclosed in U.S. Pat. No. 7,313,972, the entire disclosure of which is incorporated by reference herein.

Figure 9:
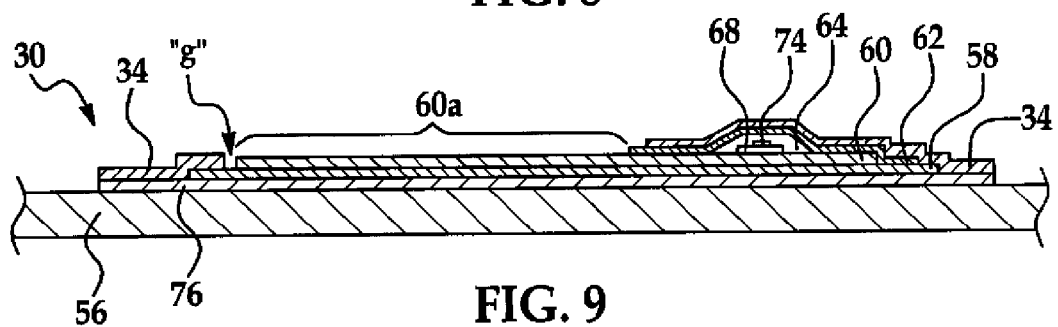
FIG. 9 is an illustration similar to FIG. 5 but showing the use of a layer of bonding adhesive for bonding the sensor to an aircraft skin.

The p-static sensor 32 and the corona guard 34 may be secured to the skin 56 using any of a variety of techniques. For example, as shown in FIG. 9, the sensor 32, and particularly the bottom dielectric layer 58 along with the corona guard 34 may be secured to the skin 56 by a layer of bonding adhesive 76. In those applications where the skin 56 is a composite material, the bonding adhesive 76 may be co-cured with the skin 56.

Figure 10:
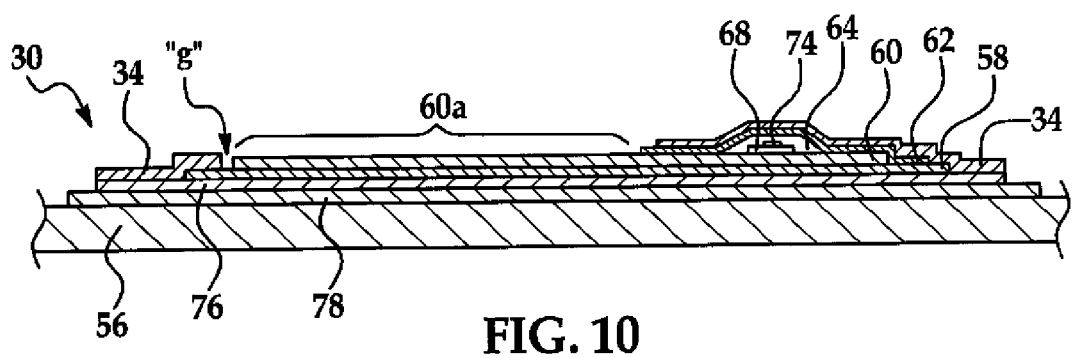
FIG. 10 is an illustration of a sectional view similar to FIG. 9 but showing the sensor bonded to a substrate that is bonded or co-cured with the aircraft skin.

FIG. 10 illustrates another technique of attaching the device 30 to the skin 56 wherein the bottom dielectric layer 58 and the corona guard 34 are bonded by a layer of adhesive 76 to a substrate 78. The substrate 78 may be secured to the skin 56 by any suitable means including an adhesive (not shown) which allows the substrate to be removed from the skin or by mechanical fasteners (not shown) which allows the substrate 78 and thus, the entire sensor 30, to be removed for repair or replacement.

Figure 11:
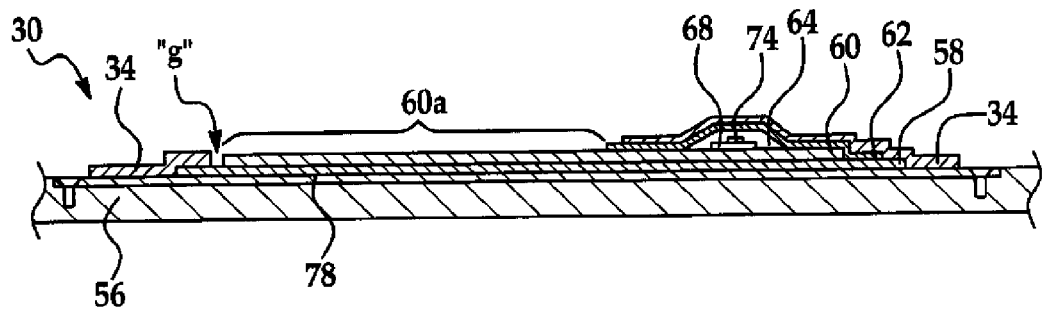
FIG. 11 is an illustration of a sectional view similar to FIG. 10 but showing the substrate recessed within the skin and mechanically secured thereto by fasteners.

FIG. 11 illustrates another technique for mounting the sensor device 30 on the skin 56 in which the device 30 is adhesively secured to a substrate 78 received within a recess 82 in the skin 56 so as to lie substantially flush with the skin 56. In this example, fasteners 80 are used to removable secure the substrate 7B to the skin 56.

Figure 12:
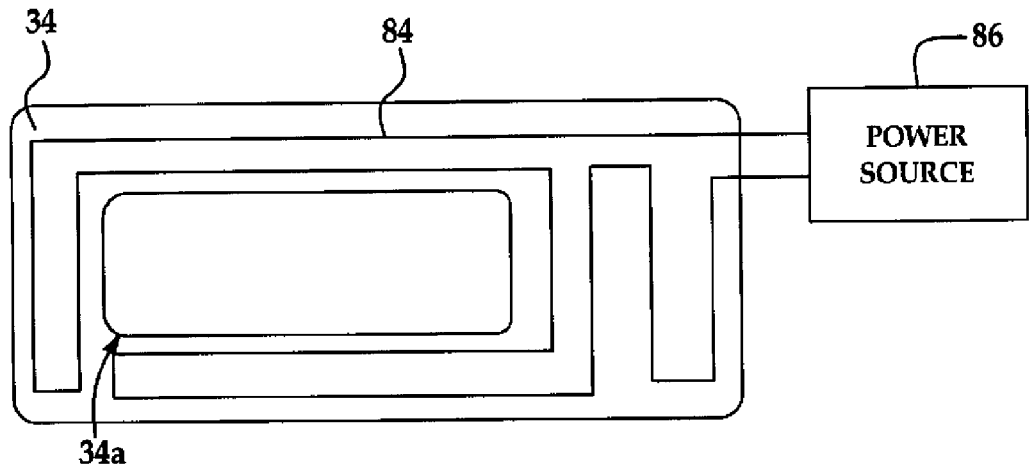
FIG. 12 is an illustration of a combined plan and block diagram view of the corona guard having an integrated heating element, along with an associated power source.
Figure 13:
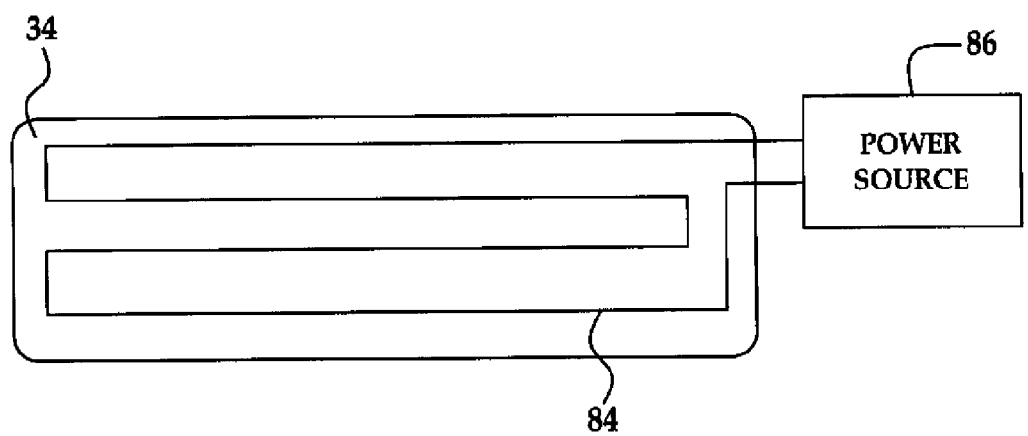
FIG. 13 is an illustration of a combined plan view block diagram of the bottom dielectric layer of the device shown in FIG. 5 having an integrated heating element, along with an associated power source.

In some applications, it may be necessary or desirable to avoid icing of the sensor device 30 caused by rain, snow, or sleet encountered at freezing temperatures. Referring to FIG. 12, ice build-up on the sensor device 30 may be avoided by incorporating a heating element 84 into the corona guard 34. The heating element 84, which may be coupled with a suitable electrical power source 86, substantially surrounds the cutout 34a and thus may provide sufficient heat to melt any ice that might accumulate on the exposed detector region 60a (not shown in FIG. 12). Alternatively, as shown in FIG. 13, a heating element 84 may be incorporated into the lower dielectric layer 58. The heat generated within the dielectric layer 58 may be conducted upwardly, as shown in FIG. 5 to heat the exposed detector regions 60a and prevent ice buildup.

As previously indicated, the sensing device 30 may be mounted on any of various locations on the aircraft 38 in order to allow tests to be performed which measure the magnitude of p-static, or to control onboard systems. FIG. 14 illustrates one technique for mounting the sensor 30 on a tail assembly 88 of an aircraft 38. In this example, the device 30 is mounted on a cone-shaped drogue 90 which is attached to the tail assembly 88 by a tether 92. In some applications, the drogue 90 may comprise an integral part of the tail assembly 88. The length of the tether 92 may be adjusted to control the distance between the drogue 90 and the aircraft 88. This arrangement may be useful in generating p-static data that could be used to determine either a charge per unit on the drogue 90 or to chart a weather cell that the aircraft 38 has just passed through.

FIG. 15 illustrates a leading edge 98 of a wing 100 in which the p-static sensor 30 is mounted on a structural module 94 so as to form, or conform to a part of the skin 56. The module 94, and thus the sensor 30, is removably mounted in a recess 96 formed in the wing 100. This modular packaging of the p-static sensor 30 allows the sensor 30 to be removed as part of a module 94 to facilitate quick and simple replacement in the field. While FIG. 15 shows the module 94 as being located on a leading edge 98, the module 94 may be located at other areas on the aircraft 38.

As previously indicated, the p-static sensor device may be used in a wide range of applications on an aircraft 38. For example, as shown in FIG. 16, the device 30 may be mounted within the interior 104 of a fuel tank 102 on the aircraft 38. The device 30 may be coupled with a p-static measuring system 36 which allows the pilot or other personnel to determine the amount of static charge buildup within the fuel tank 102.

Figure 17:
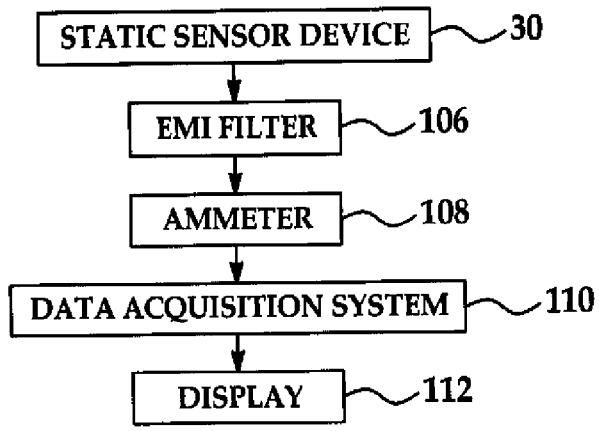
FIG. 17 is an illustration of a block diagram of a system for sensing, measuring and displaying the triboelectric and precipitation charge accumulation on an aircraft.

FIG. 17 illustrates the basic components of a system for measuring a p-static charge using the disclosed static sensor device 30. The sensor device 30 produces an electrical signal having a magnitude that is related to the accumulated p-static charge on the device 30. This signal may be filtered by an electromagnetic interference (EMI) filter at 106 and delivered to an ammeter 108 which converts the signal to a current reading. In some embodiments, a pilot or other on-board personnel may read the ammeter 108, directly in real time. In other embodiments, the current reading may be processed by a data acquisition system 110 which may store or process the measurements, and deliver the measurements to a display 112 for analysis of the measured level of static charge accumulation.

Figure 18:
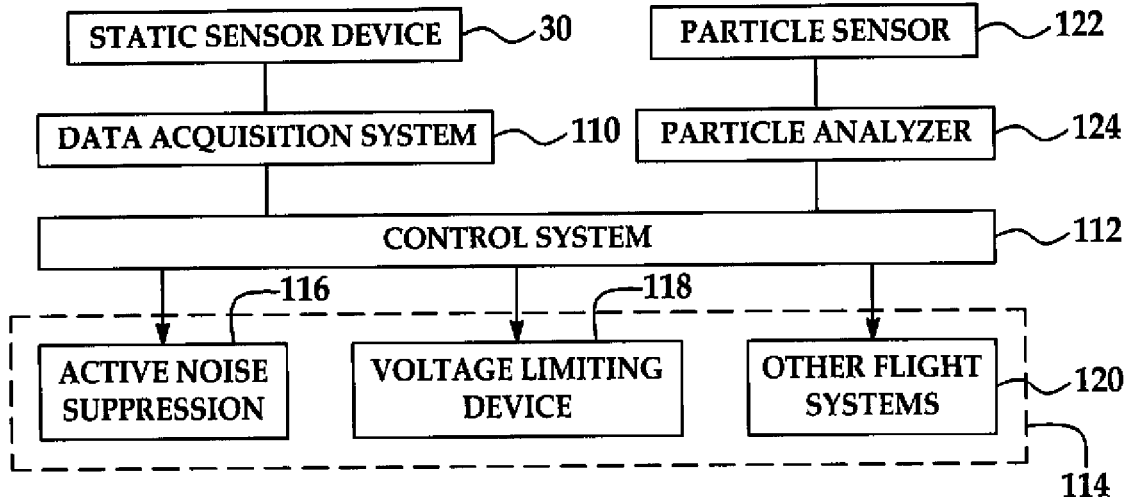
FIG. 18 is an illustration of a block diagram of a system for controlling onboard flight systems using measurements of charge accumulation and an analysis of particles.

FIG. 18 illustrates a system employing the p-static sensor device 30 which may be used to control any of various onboard flight systems. The measured p-static charge developed by the sensor device 30 is processed by a data acquisition system 110 which processes the measurements and delivers information to an onboard control system 112. Optionally, a particle sensor 122 may be mounted on the aircraft 38 which senses the impingement on the sensor of particles such as dust, rain, sleet or snow. In some embodiments, it may be possible to combine the p-static charge sensor device 30 and the particle sensor 122 into a single device.

A particle analyzer 124 may be used to analyze the data produced by the particle sensor 122. For example, the particle analyzer 124 may measure the size of the particles, the rate of impingement of the particles, and/or the density of the particles. The information generated by the particle analyzer 124 is fed to the control system 112 which may combine the information generated by the p-static charge sensor device 30 and the particle sensor 122 to control any of a variety of onboard flight systems 114. For example, control system 112 may control an active noise suppression system 116 which may adjust the threshold of noise suppression used by onboard communication radios, or which may switch communications to a different channel that is less susceptible to interference from noise created by p-static charges on the aircraft 38. The control system 112 may also control a voltage limiting device 118 that may aid or replace static dischargers by lowering or eliminating the potential on the aircraft 38 by actively shunting this voltage to an auxiliary storage device (not shown).

Figure 19:
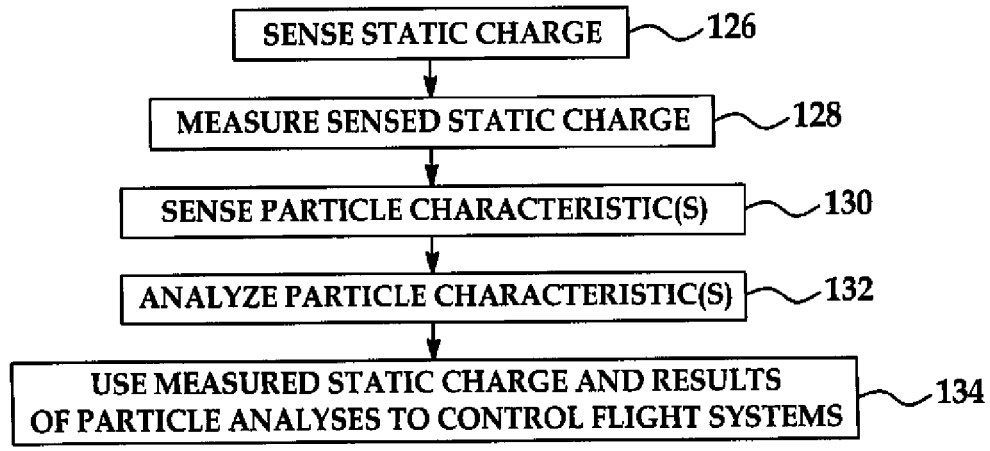
FIG. 19 is an illustration of a flow diagram of a method for controlling onboard flight systems using p-static charge measurements and characteristics of particles responsible for producing the charge.

The system shown in FIG. 18 may be used to control onboard flight systems using the method shown in FIG. 19. Static charges on the aircraft are sensed at 126 and are measured at 128. Any of various particle characteristics are sensed at 130, using the particle sensor 122 shown in FIG. 18. At step 134, the measured static charges and the results of the particle analysis may be used to control onboard flight systems 120.

Figure 20:
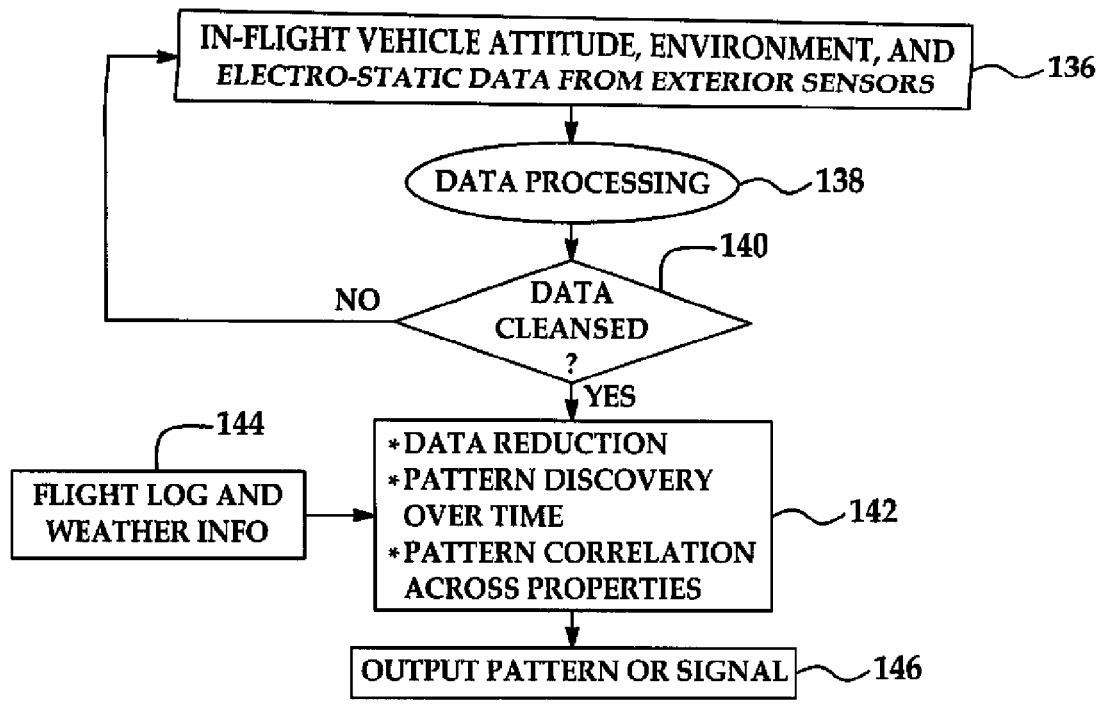
FIG. 20 is an illustration of a flow chart of a software implemented algorithm used to initially tune a flight controlled system employing p-static charge measurements.
Figure 21:
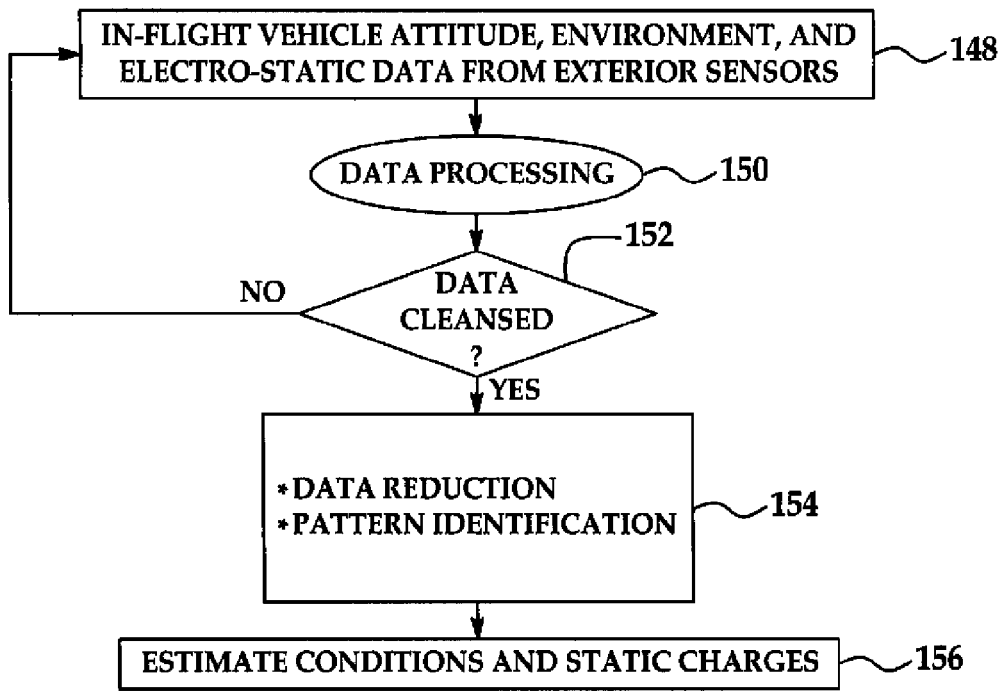
FIG. 21 is an illustration of a flow chart of a software program used to control onboard flight systems based on the algorithm shown in FIG. 20.

FIGS. 20 and 21 illustrate flow charts of software suitable for implementing the control system shown in FIG. 18 and the method described in connection with FIG. 19. FIG. 20 shows components of the software used to implement an algorithm during the tuning and learning stages of the control system, while FIG. 21 illustrates the components of the software used to implement the control system. Referring to FIG. 20, a variety of data may be input to the system, including but not limited to in-flight aircraft altitude and attitude, meteorological data, particle count and size, p-static data from the sensor device 30, and e-field measurements, to name only a few. This data is processed at 138 and is cleansed at 140. If any errors are noted in the data, then steps 136 and 138 are repeated, otherwise the data is processed by a subroutine at 142 where the data may be reduced and data patterns may be discovered over time or correlated across various properties. Also, the data may be rescaled and anomalies may be removed using the subroutine 142. The processes performed by subroutine 142 may use flight log and weather information 144 in order to perform the desired pattern correlations or pattern discoveries. The final output pattern or signals are produced at 146.

Referring to FIG. 21, in the implementation stage of the control system, data is input at 148, similar to the data that was input at 136 in FIG. 20. The input data is processed at 150 and cleansed at 152, similar to the processes 138 and 140 in FIG. 20. At 154, a subroutine reduces the data and identifies patterns based on the algorithms that were learned as part of the processing at 142 in FIG. 20. The processes performed at 154 may include principle component analysis, intervention analysis, cross correlations, multivariate time series filter or predictive models. The patterns identified at 154 may be used to estimate conditions and p-static charges at 156 which in turn may be used to control onboard flight systems.

Figure 22:
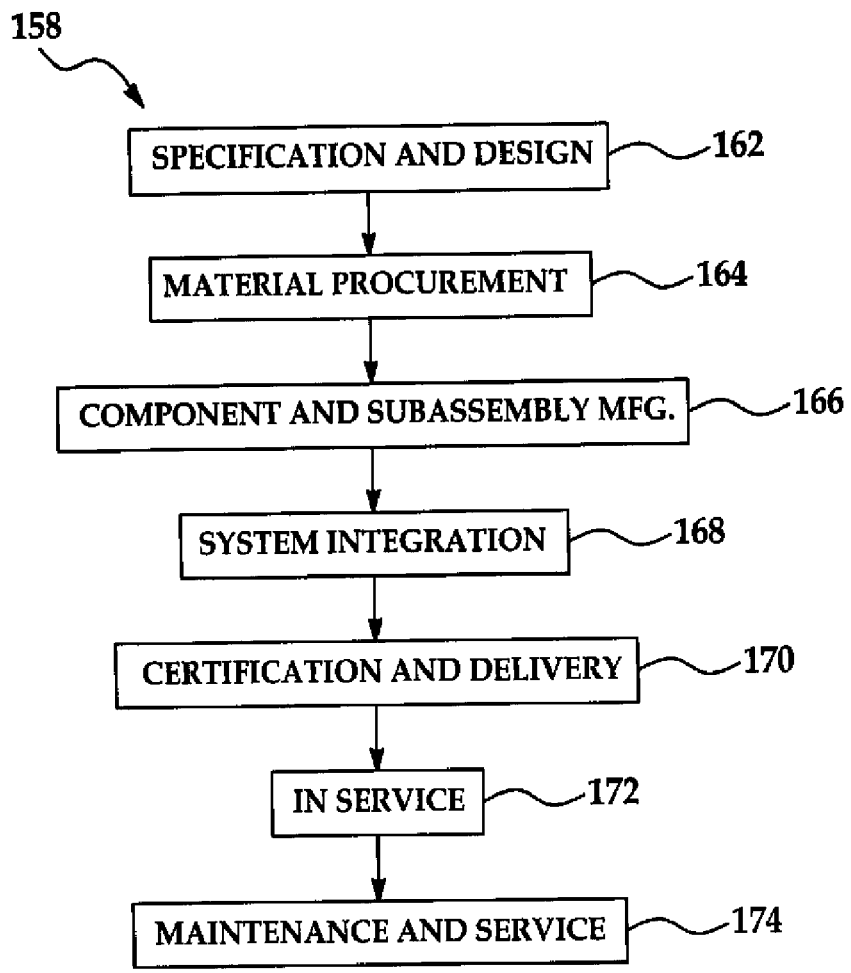
FIG. 22 is an illustration of a flow diagram of aircraft production and service methodology.
Figure 23:
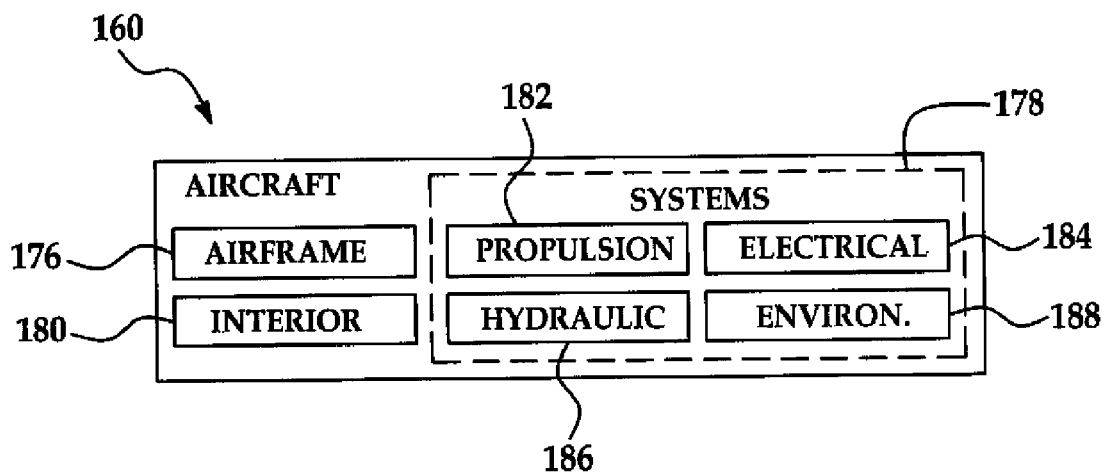
FIG. 23 is an illustration of a block diagram of an aircraft.

Embodiments of the disclosure may find use in a variety of potential applications, particularly in the transportation industry, including for example, aerospace applications. Thus, referring now to FIGS. 22 and 23, embodiments of the disclosure may be used in the context of an aircraft manufacturing and service method 158 as shown in FIG. 22 and an aircraft 160 as shown in FIG. 23. During pre-production, exemplary method 158 may include specification and design 162 of the aircraft 160 and material procurement 164 in which the sensor device 30 may be specified for use in measuring p-static charge accumulation on the aircraft 160. During production, component and subassembly manufacturing 166 and system integration 168 of the aircraft 160 takes place. The disclosed sensor device 30 may be permanently installed in an assembly during these production processes. Thereafter, the aircraft 160 may go through certification and delivery 170 in order to be placed in service 172. While in service by a customer, the aircraft 160 is scheduled for routine maintenance and service 174 (which may also include modification, reconfiguration, refurbishment, and so on). The disclosed method may be used to measure p-static during the certification and delivery process 170 and/or during maintenance and service 78.

Each of the processes of method 158 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 23, the aircraft 160 produced by exemplary method 158 may include an airframe 176 with a plurality of systems 178 and an interior 180. Examples of high-level systems 178 include one or more of a propulsion system 182, an electrical system 184, a hydraulic system 186, and an environmental system 188. Any number of other systems may be included. The disclosed sensor device 30 may be installed on the airframe 80 and may be integrated into the electrical system 184. Although an aerospace example is shown, the principles of the disclosure may be applied to other industries, such as the marine and automotive industries.

The disclosed method and device for measuring p-static may be employed during any one or more of the stages of the production and service method 158. For example, components or subassemblies corresponding to production process 70 may incorporate one or more of the p-static sensors 30. Also, one or more method embodiments, or a combination thereof may be utilized during certification and delivery 170, and while the aircraft 160 is in service 172.

Although the embodiments of this disclosure have been described with respect to certain exemplary embodiments, it is to be understood that the specific embodiments are for purposes of illustration and not limitation, as other variations will occur to those of skill in the art.

What is claimed:

1. A device comprising:
a sensor installed over a surface, the sensor being configured to sense p-static charge accumulation resulting from impingement of particles on the sensor, the sensor including:
a first dielectric layer installed directly on the surface;
a second dielectric layer installed over a first portion of an electrically conductive layer such that the electrically conductive layer is sandwiched between the first and second dielectric layers, a second portion of the electrically conductive layer being exposed to the particle impingement, and the device further comprising:
a corona guard installed over the surface and substantially surrounding the sensor, first edges of the corona guard being spaced from second edges of the electrically conductive layer of the sensor around the second portion, and the corona guard overlying the electrically conductive layer of the sensor outside of the second portion.

2. The device of claim 1, wherein the corona guard includes:
an electrically conductive element spaced from and circumscribing the second portion.

3. The device of claim 1, wherein the corona guard substantially surrounds the sensor in one or more planes substantially parallel to the electrically conductive layer.

4. The device of claim 1, further comprising:
a heater configured to heat the sensor.

5. The device of claim 4 wherein the heater includes an electrical heating element on the corona guard and coupled with a source of electrical power.

6. The device of claim 1, wherein the corona guard is generally flat and extends outwardly beyond a perimeter of the sensor, and wherein the sensor is generally flat.

7. Apparatus for sensing p-static charge accumulation resulting from the impingement of particle on an aircraft, comprising:
a p-static sensor device, including a p-static charge sensor and a corona guard for guarding against corona discharge from the p-static charge sensor, the p-static charge sensor including:
a first dielectric layer installed directly on a surface of the aircraft;
a second dielectric layer installed over a first portion of an electrically conductive layer such that the electrically conductive layer is sandwiched between the first and second dielectric layers, a second portion of the electrically conductive layer being exposed to the particle impingement, first edges of the corona guard being spaced from second edges of the electrically conductive layer of the sensor around the second portion, and the corona guard overlying the electrically conductive layer of the sensor outside of the second portion, and the device further comprising:
means for mounting the p-static sensor device on the aircraft.

8. The apparatus of claim 7, wherein the mounting means includes:
a drogue having the static sensor device mounted thereon, and
a tether connecting the drogue with aircraft for towing the drogue a preselected distance behind the aircraft.

9. The apparatus of claim 7, wherein the mounting means includes:
a module having the static sensor device mounted thereon, the module being removable from the aircraft and forming part of an outer skin of the aircraft.

10. The apparatus of claim 7, wherein the p-static sensor device is mounted within the interior of a fuel tank on the aircraft.

11. The apparatus of claim 7, wherein the mounting means includes:
a substrate having the p-static sensor device secured thereto, and
fastening means for removably fastening the substrate on the aircraft.

12. The apparatus of claim 7, wherein the mounting means includes a layer of bonding adhesive.

13. A method of measuring a static charge resulting from impingement of particles over an aircraft, the aircraft comprising a p-static charge sensor mounted on a surface of the aircraft, the sensor including a first dielectric layer installed directly on the surface, a second dielectric layer installed over a first portion of an electrically conductive layer such that the electrically conductive layer is sandwiched between the first and second dielectric layers, a second portion of the electrically conductive layer being exposed to impingement of particles, and the sensor further comprising a corona guard installed over the surface and substantially surrounding the sensor, first edges of the corona guard being spaced from second edges of the electrically conductive layer of the sensor around the second portion, and the corona guard overlying the electrically conductive layer of the sensor outside of the second portion, and the method comprising:
using the p-static charge sensor to accumulate a static charge on the second portion of the electrically conductive layer resulting from the impingement of particles on the sensor;
suppressing corona discharge from the sensor using the corona guard; and,
converting the p-static charge accumulation on the sensor into data related to magnitude of the accumulated static charge on surfaces of the aircraft.

14. The method of claim 13, further comprising:
sensing the impingement of the particles on the aircraft;
analyzing impinging particles; and
using combined results of analysis of the impinging particles and the data to control at least one system on-board the aircraft.

15. The method of claim 14, wherein the analysis of the impinging particles includes analyzing at least one of:
a size of the impinging particles
a rate of impingement of the particles, and
a density of the impinging particles.

* * * * *